(12) United States Patent
Gotoh et al.

(10) Patent No.: US 7,638,797 B2
(45) Date of Patent: Dec. 29, 2009

(54) SUBSTRATE OF EMITTING DEVICE AND EMITTING DEVICE USING THE SAME

(75) Inventors: Tomohisa Gotoh, Tokyo (JP); Noriko Takewaki, Osaka (JP); Hisanao Tsuge, Tokyo (JP); Atsushi Kamijo, Tokyo (JP); Satoru Toguchi, Tokyo (JP)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/123,811

(22) Filed: May 20, 2008

(65) Prior Publication Data

US 2008/0265245 A1 Oct. 30, 2008

Related U.S. Application Data

(63) Continuation of application No. 10/861,343, filed on Jun. 7, 2004, now Pat. No. 7,391,048.

(30) Foreign Application Priority Data

Sep. 10, 2003 (JP) ............... 2003-319106

(51) Int. Cl.
*H01L 33/00* (2006.01)
(52) U.S. Cl. .................................... 257/40
(58) Field of Classification Search .................. 257/40
See application file for complete search history.

(56) References Cited

U.S. PATENT DOCUMENTS

| | | | |
|---|---|---|---|
| 3,858,965 A | 1/1975 | Sumita |
| 3,860,813 A | 1/1975 | Herzog et al. |
| 4,310,784 A | 1/1982 | Anthon et al. |
| 4,672,187 A | 6/1987 | Fujita et al. |
| 5,894,366 A | 4/1999 | Ferrante et al. |
| 5,932,895 A | 8/1999 | Shen et al. |
| 5,946,281 A | 8/1999 | Ito et al. |
| 6,117,529 A | 9/2000 | Leising et al. |
| 6,172,778 B1 | 1/2001 | Reinhorn et al. |
| 6,618,104 B1 | 9/2003 | Date et al. |
| 6,762,553 B1 | 7/2004 | Yokogawa et al. |
| 7,180,235 B2 | 2/2007 | Gotoh et al. |
| 7,391,048 B2* | 6/2008 | Gotoh et al. .............. 257/40 |
| 2001/0033135 A1 | 10/2001 | Duggal et al. |
| 2002/0036958 A1 | 3/2002 | Wada et al. |
| 2003/0043571 A1 | 3/2003 | Toguchi et al. |
| 2003/0062520 A1 | 4/2003 | Toguchi et al. |
| 2003/0124392 A1 | 7/2003 | Bright |
| 2004/0160171 A1 | 8/2004 | Takahashi |
| 2005/0127832 A1 | 6/2005 | Toguchi et al. |

FOREIGN PATENT DOCUMENTS

| | | |
|---|---|---|
| CN | 1210660 | 3/1999 |
| JP | 2003-031374 | 1/2003 |

(Continued)

*Primary Examiner*—Thomas L Dickey
(74) *Attorney, Agent, or Firm*—H.C. Park & Associates, PLC

(57) ABSTRACT

Provided is a substrate for a light-emitting device having good light emitting efficiency and light-emitting device using the substrate. A light transparent substrate 10 is layered with a first layer 30 having a refractive index higher than that of the light transparent substrate 10 and a second layer 40 having a refractive index lower than that of the first layer. The refractive index of the first layer 30 is set to be 1.35 times as high as that of the second layer 40. With this layer structure, in an emitting layer of the light-emitting device, a wave front of a spherical wave form exited from a point light source in the front direction is converted into that of a plane wave form, and exited outside the substrate at a high efficiency.

18 Claims, 7 Drawing Sheets

FOREIGN PATENT DOCUMENTS

| | | |
|---|---|---|
| JP | 2003-249364 | 9/2003 |
| JP | 2003-297572 | 10/2003 |
| JP | 2004-134158 | 4/2004 |
| KR | 1999-0076085 | 10/1999 |
| KR | 10-2001-0051778 | 6/2001 |
| WO | 02-37580 | 5/2002 |
| WO | 03-084291 | 10/2003 |

* cited by examiner

SUBSTRATE OF EMITTING DEVICE AND EMITTING DEVICE USING THE SAME

CROSS-REFERENCE TO RELATED APPLICATIONS

This application is a continuation of application Ser. No. 10/861,343, filed on Jun. 7, 2004, and claims priority from and the benefit of Japanese Patent Application No. 2003-319106, filed Sep. 10, 2003, which are both hereby incorporated by reference as if fully set forth herein.

BACKGROUND OF THE INVENTION

1. Field of the Invention

The present invention relates to a substrate for a light-emitting device and an optical device using the same.

2. Description of the Related Art

An organic electroluminescence (EL) device is a spontaneous emitting display device employing a principle that fluorescent material emits light in response to recombination energy of holes injected from an anode and an electrons injected from a cathode when an electric field is applied. After a layered low-voltage driven organic EL device is reported, studies on the organic EL device using an organic material as a constituent material have been briskly performed.

Tang et al. teaches that an emitting layer is formed of a tris(8-quinolinol)aluminum, and a hole transporting layer is formed of a tri-phenyl thiamine derivative. The layered structure has advantages, for example, in that efficiency of injecting the holes into the emitting layer is increased, that efficiency of creating excitons by means of the recombination is increased by blocking electrons injected from the cathode, and that the created excitons are confined in the emitting layer.

In this manner, as a structure of the organic EL device, there has been widely known a two-layered structure composed of a hole transporting (injecting) layer and an electron transportable emitting layer, or a three-layered structure composed of a hole transporting (injecting) layer, an emitting layer and an electron transporting (injecting) layer. In order to enhance recombination efficiency of injected holes and electrons in the device having the layered structure, structure of the device and method of fabricating the device has been studied.

However, in the organic EL device, the upper limit of a light-emitting probability exists because of restriction on a singlet formation probability rather than dependency on the spin statistics during recombination of carriers. The upper limit is known to be about 25%.

Further, in the surface light-emitting device having a wave front of a spherical wave form, such as the organic EL device, in which the emitting layer is at least interposed between the anode and the cathode, because a light-emitting member has a refractive index higher than that of a substrate or air, light having an exit angle larger than the critical angle causes the total reflection at a substrate/air interface, so that the light cannot be taken out. It is known that, when the refractive index of the light-emitting member is 1.6, only about 20% of the emitted light can be effectively utilized.

For this reason, the upper limit of the total energy conversion efficiency including the singlet formation probability is forced to be about 5% in total. In the organic EL device in which the light-emitting is strictly restricted, the low efficiency of the light emitting incurs decrease of the energy conversion efficiency considered to be fatal.

Conventionally, several proposals have been provided as an approach for elevating the light emitting efficiency.

For example, Japanese Patent Publication No. S63(1988)-314795 discloses a method of forming a lens on a substrate. Here, the substrate makes use of one having capability of collecting light such as a cell fork or a convex lens.

Japanese Patent Publication No. H01(1989)-200394 discloses a method of forming a reflection surface as a means for enhancing the light emitting efficiency. Here, it is characterized in that a mirror reflecting light is provided on one surface of an emitting layer and takes a mortar form. Therefore, a loss of light leaking out around the emitting layer is improved.

Japanese Patent Publication No. H13(2001)-202827 proposes a method of disposing a layer having a low refractive index between a substrate and an electrode layer. The disclosed technology includes a transparent dielectric layer (electrode layer) in contact with at least one surface of the low refractive index layer, and realizes enhancement of an emitting rate of propagating the light outside because the light passing through the low refractive index layer is allowed to enhance the emitting rate to the air, enhancement of an emitting rate of propagating the light outside because a refractive index of the low refractive index layer is from 1.003 to 1.300 and thus the light passing through the low refractive index layer is allowed to enhance the emitting rate to the air, and a very low refractive index approaching 1 (one) because a silica aerogel is used for the low refractive index layer.

Japanese Patent Publication No. H15(2003)-31374 discloses a light-emitting device having an anti-reflection layer in which high refractive index layer, low refractive index layer and high refractive index layer are deposited between a substrate and an emitting layer in that order. FIG. 1 of the document shows a structure having an optical multilayer element 2 where the high refractive index layer H1, the low refractive index layer L1, and the high refractive index layer as an anode layer 2A are deposited in that order between the substrate 1 formed of glass and an organic EL layer 3. And, the paragraph [0025] discloses that the optical multilayer element 2 has an anti-reflection function and thus efficiency of extracting the light from the substrate 1 is improved.

When a so-called anti-reflection layer is composed of a single layer and satisfies nd=$\lambda$/4 (where d is the thickness of the physical layer and $\lambda$ is the used wavelength), reflection light is eliminated by interference of the light. The technology described in the document is a kind of this anti-reflection layer and has a multi-layered structure. In the structure described in the embodiment, the high refractive index layer H1, the low refractive index layer L1 and the anode layer 2A have 14.2 nm, 41.5 nm and 139.8 nm in thickness, respectively (paragraph [0015]). The thickness of each layer is set to be less than a half wavelength with respect to the light-emitting wavelength of 400-700 nm. The multilayer disclosed in the document is a kind of so-called anti-reflection layer.

However, the conventional technologies leave additional room for improvement in the following respects.

Both the method of forming a lens on a substrate and the method of forming a reflection surface, which are described in Japanese Patent Publication Nos. S63-314795 and H01-200394 respectively, are effective for a large-sized device having a large emitting area, but has a difficulty in forming a lens having capability of collecting light, a lateral reflection surface, etc. in a small-sized device having a small pixel area, such as a dot matrix display. Particularly, in the organic EL device, because the thickness of the emitting layer is less than several microns, it is difficult not only to form the reflection mirror, which has a tapered surface on the lateral surface of the device, even by use of the current technique, but also to avoid sharp increase of cost.

The method of disposing a layer having a low refractive index between a substrate and an electrode layer, which is described in Japanese Patent Publication No. 2001-20827, is effective in that the light emitting efficiency is improved by collection of the light within the critical angle. However, since the light is reflected at the interface between the anode and the low refractive index layer, improvement of the light emitting efficiency is still considered to be insufficient.

Further, in the case of using the polished silica aerogel layer in order to obtain the very low refractive index layer, a mechanical strength of the layer is very weak. Further, a short of the electrode caused by surface unevenness of the polished layer is generated, so that portions where the light is not emitted (dark spots) are generated. Light extracting technique effective for the organic EL device does not still reach a satisfactory level.

The method of providing an anti-reflection layer, which is described in Japanese Patent Publication No. 2003-31374, has a limitation to improvement of the light emitting efficiency in view of its function (which will be described in the present embodiments).

Further, as known, because the anti-reflection layer has high dependency on the wavelength, the structure has the light emitting efficiency changed to a great extent by the emission wavelength. For this reason, when the technique of the document is employed to the light-emitting device for a white color, a quantity of light emitted outside the substrate is greatly changed by the wavelength, so that deterioration of white balance becomes problematic.

Moreover, because the anti-reflection layer removes reflection of the light using the interference of the light, it is necessary to form the thickness or the refractive index of the layer so as to satisfy a predetermined condition. Therefore, in the case that the thickness of the layer is slightly changed by fabrication factors, the reflectivity of the anti-reflection layer is changed. As a result, the light-emitting device is vulnerable to an error in its performance.

SUMMARY OF THE INVENTION

Therefore, in view of the foregoing, an objective of the present invention is to provide a substrate for a light-emitting device and light-emitting device using the same, in which the problems of the prior arts are solved and the light emitting efficiency is good.

As described in the prior arts, proposals has been provided up to now from the viewpoint of providing capability of collecting the light to the substrate or forming the anti-reflection layer for preventing reflection of the light between the substrate and the emitting region. By contrast, the inventor of the present invention had consideration from the viewpoint different from the proposals, thus succeeded in remarkably improving the light emitting efficiency. In other words, the inventor found that the light emitting efficiency can be improved by providing an optical control portion where emission is subjected to wave front conversion on a transparent substrate and induced to the transparent substrate, thus leading to completion of the present invention.

According to the present invention, there is provided a substrate for a light-emitting device, comprising a transparent substrate and an optical control portion, wherein the optical control portion is provided on the transparent substrate, converts incident light of a spherical wave into light of a plane wave form, and induces the converted light to the transparent substrate.

Further, according to the present invention, there is provided a light-emitting device, comprising a transparent substrate, an optical control portion which is provided on the transparent substrate, converts incident light of a spherical wave into light of a plane wave form, and induces the converted light to the transparent substrate, an electrode layer provided on the optical control portion, and an emitting layer provided on the electrode layer.

According to the present invention, light emitting efficiency is remarkably improved by action of the optical control portion provided on the transparent substrate. The optical control portion is configured to perform wave front conversion of emission of the spherical wave form, which is emitted from an emitting region located on the upper portion of the optical control portion, into the light of the plane wave form, and to induce the converted light to the transparent substrate. Because the light of the plane wave form is induced to the transparent substrate, it is possible to effectively decrease reflection or loss of the light between the transparent and the layer neighboring to the transparent substrate. As a result, it is possible to remarkably improve the light emitting efficiency.

Herein, the light of the plane wave form means that pointing vectors of the light are substantially parallel. On the surface vertical to the traveling direction of the light, it should not be required to have a phase of the light. The wave front conversion refers to converting a wave front in order to enhance directionality of the light, and converting the spherical wave of the type that the pointing vectors are spread into the light of the above-mentioned plane wave form. A specific configuration for carrying out the wave front conversion into the plane wave form may be variously employed. For example, by introducing a modulation region of the refractive index into the optical control portion and adjusting the traveling of the light in a proper manner, it is possible to carry out the wave front conversion.

Further, the substrate for the light-emitting device refers to one configured to mount the emitting region on the upper portion of the optical control portion. The emitting region may be variously employed. For example, it can be implemented as the emitting layer of the organic or inorganic EL device.

In the present invention, the optical control portion may be realized as an optical control layer having a refractive index distribution in the layer provided on the transparent substrate.

In this configuration, a place where a region having a low refractive index and a region having a high refractive index are adjacent to each other may become a region for the wave front conversion with ease. In other words, when the light is introduced from the region of the low refractive index into the region of the high refractive index, the wave front of the light is converted at an interface between the two regions. Thus, the emission of the spherical wave form is changed into the light of the plane wave form. With this configuration, the optical control portion takes a layered form, so that it is possible to get an advantage in that structural stability is excellent.

In the present invention, the optical control layer may be configured to include a first layer provided on the transparent substrate and a second layer provided on the first layer and having a refractive index lower than that of the first layer. This configuration becomes a conversion region of the interface between the first and second layers. At this interface, the wave front of the light is converted, so that the emission of the spherical wave form is changed into the light of the plane wave form. Because the wave front conversion is carried out at the interface between the layers, the light of the plane wave form is induced to the transparent substrate in an good efficient and stable manner, and the light emitting efficiency is stably improved.

Here, it will do if the first layer is provided on the transparent substrate. Therefore, the light converted into the plane wave form is induced to the transparent substrate as it is, so that it is possible to effectively control the reflection or loss of the light at the interface between the transparent substrate and its upper layer.

In this manner, the optical control portion having the wave front function is provided in the layered structure constituting the device, so that the light emitting efficiency is remarkably improved. In the case of attempting to improve the light emitting efficiency by means of the effect of the optical control portion, exerting the wave front conversion function in a sufficient and stable manner plays a role as an important technical problem. Further, when intending to form the optical control portion having the sufficient wave front conversion function, it is important to select, combine and use an appropriate material. Hence, it is important to employ a structure of the layer so that freedom of the material selection becomes large. When the optical control portion having the wave front conversion is provided, this new problem is generated. In regard to this problem, the present invention provides the following configuration.

Specifically, according to the present invention, there is provided a layered structure satisfying the relation: $n_1 \geq 1.3\, n_2$ where the refractive index of the first layer is $n_1$, and the refractive index of the second layer is $n_2$. Therefore, a refractive index difference between the first and second layer becomes great, so that the wave front conversion function is exerted in a sufficient and stable manner, and the light emitting efficiency is remarkably improved.

In the present invention, an electrode layer may be further provided on the optical control layer, and the refractive index of the second layer may be less than that of the electrode layer. Therefore, it is possible to have a great refractive index difference between the first and second layers, so that the wave front conversion function is exerted in a sufficient and stable manner, and the light emitting efficiency is remarkably improved. Further, a freedom of selection of materials for the first and second layers is improved.

Here, it is good to make the refractive index of the first layer greater than the refractive index of the second layer. Accordingly, the light emitting efficiency is still more remarkably improved.

Further, it is good to make the refractive index of the second layer more than 1.35. When the refractive index of the second layer is too small, a density of the second layer becomes small. For this reason, there is a possibility not to obtain a sufficient mechanical strength.

Further, the optical control layer may be configured to have a refractive index distribution where the refractive index is decreased from the transparent substrate toward its upper portion. When the light travels form the high refractive index region to the low refractive index region, the reflection or loss of the light is generated at the interface between the regions. According to the configuration, when the emitting portion is provided on the optical control layer so that the light is exited from the transparent substrate, a layer structure where the refractive index is lowered along the traveling direction of the light is obtained. For this reason, there is no interface where the reflection or loss of the light is generated, so that the light emitting efficiency is remarkably improved.

In the configuration, the refractive index distribution is adapted so that the refractive index is decreased from the transparent substrate toward its upper portion, but it does not matter that a distribution profile is decreased in a step form or continuously. Further, it will do if the refractive index is decreased in a thickness direction of the layer across the entire optical control layer or at some regions.

In the present invention, when a peak wavelength of the emission of the light-emitting device mounted on the substrate for the light-emitting device is denoted by $\lambda$, the refractive index of the first layer is denoted by $n_1$, and the thickness of the first layer is denoted by $d_1$, it is possible to given as follows: $n_1 d_1 \geq \lambda/2$ Further, when the refractive index of the second layer is denoted by $n_2$, and the thickness of the second layer is denoted by $d_2$, it is possible to given as follows: $n_2 d_2 \geq \lambda/2$ Therefore, the emission is properly subjected to the wave front conversion at the interface between the first and second layers, and is changed into the light of the plane wave form, so that it is possible to stably obtain an effect of improvement of the light emitting efficiency.

In the present invention, it does not matter that the transparent substrate is provided with a driving circuit for the light-emitting device. For example, an element such as TFT may be provided.

In the light-emitting device of the present invention, the emission from the emitting layer may be configured like colored emission. Therefore, the optical control layer performs a more stable function. The optical control layer undergoes a slightly different refractive index according to a wavelength. For this reason, when the optical control layer is designed for the emission of monochromatic light, a still more secure effect is obtained. As the monochromatic light, for example, a blue light is properly used.

The light-emitting device of the present invention is applied to various types of optical devices.

For example, it may be applied to the organic EL device, the inorganic EL device, a light-emitting diode and so forth.

Herein, a direction directing from the transparent substrate to the optical control portion is defined as an upward direction.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

A substrate for a light-emitting device according to the present invention is used for a light-emitting device, for example an organic electroluminescence (EL) device, an inorganic EL device, a plasma display or a light-emitting diode (LED), which emits light in response to an external impetus such as a voltage. Particularly, a significant effect is exerted to a device in which emission becomes point emission in a light-emitting region. For instance, emission of the EL device is a set of point emission from an emitting center at an emission. An effect of the present invention is remarkably exerted.

The present invention has efficiency of light emitting improved by action of an optical control layer. An effect on the light emitting efficiency is less dependent on a wavelength compared to an anti-reflection layer. Thus, for example, in the case of being applied to a white light-emitting device, a white balance is relatively maintained in a satisfactory manner without a great difference in a quantity of light exited outside the substrate according to a wavelength. Further, there is an advantage in that it is difficult to generate a performance error of the device which is caused by fabrication factors.

Hereinafter, the above and other objects, features and advantages of the present invention will be more apparent from the following description. Preferred embodiments of the present invention will now be described with reference to the accompanying drawings. Further, so long as separate reference is not made, a refractive index herein refers to one based on a peak wavelength of the light exited from the emitting layer. In the following embodiments, like numbers refer to like elements throughout the specification and a part of description will be omitted in order to avoid repeated description.

First Embodiment

Figure 1:
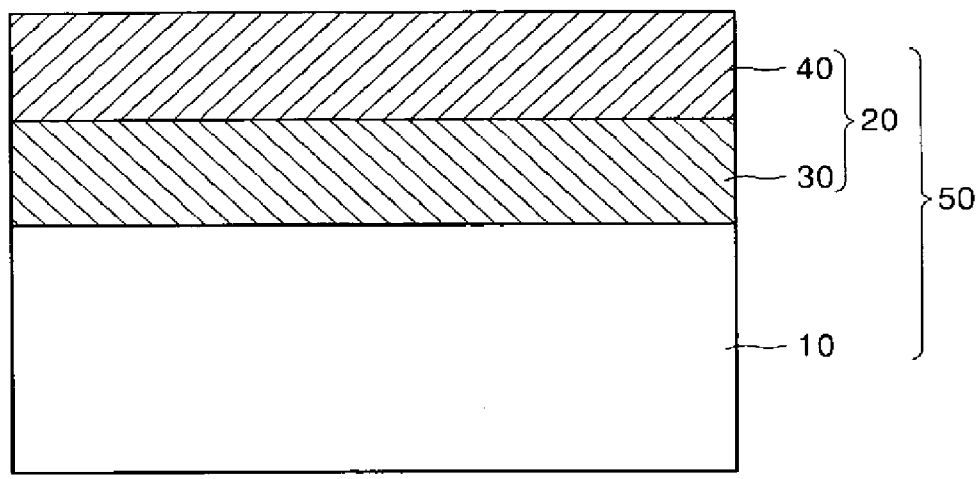
FIG. 1 shows a first example of an exemplary cross-sectional view of a substrate for a light-emitting device according to the present embodiment.

FIG. 1 is an exemplary cross-sectional view of a substrate for a light-emitting device according to the present embodiment. Specifically, a substrate 50 for the light-emitting device of the present invention is provided with an optical control layer 20 on one surface of a light transparent substrate 10. The optical control layer 20 is composed of a first layer 30 which has a refractive index higher than that of the light transparent substrate 10, and a second layer 40 which has a refractive index lower than that of the first layer 30, and has a structure where these two layers are layered from the light transparent substrate 10 in that order.

This substrate for the light-emitting device is used as a substrate of a light-emitting device by mounting an emitting region on an upper portion of the optical control layer 20. The optical control layer 20 converts a wave front of a spherical wave form of emission introduced from the upper portion thereof into that of a plane wave form. In an emitting layer, for example, of an organic EL device, an emitting center is treated as a point light source, and light emitted from the point light source travels in all directions of 360 degrees. At the typical light transparent substrate alone, when traveling from the emitting center outside the substrate, the wave front of the spherical wave form having an exit angle greater than a critical angle is reflected inside the substrate by total reflection, so that it is impossible to exit the substrate.

However, in this embodiment, the interface between the first layer 30 and the second layer 40 allows the wave front of the spherical wave form to be converted into that of the plane wave form, so that high directional light is obtained. Therefore, the wave front of the spherical wave form exited from the point light source passes through the optical control layer 20, and then converted into the wave front of the plane wave form to transmit the light transparent substrate 10 in a directional manner. For this reason, a quantity of light subjected to total reflection is little, and more light is exited outside the transparent substrate 10. Consequently, efficiency of light emitting is improved. The light exited outside the substrate is the wave front of the plane wave form, but neither the wave front of the spherical wave form nor the wave front of the cylindrical wave form. Further, each layer constituting the substrate for the light-emitting device according to the present embodiment is optically smooth, and moreover is capable of select a thin-layer material having a high mechanical strength, so that it is possible to provide high reliability on the light-emitting device. In other words, it is possible not only to control a short caused by surface unevenness of the substrate, but also to control a crack of the thin layer depending on deformation of the substrate.

Figure 2:
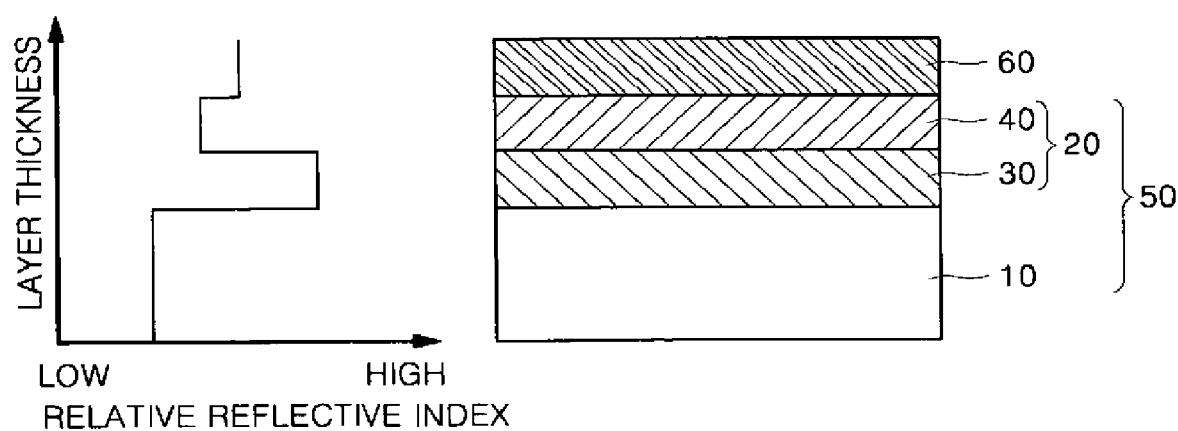
FIG. 2 shows a second example of an exemplary cross-sectional view of a substrate for a light-emitting device according to the present embodiment.

FIG. 2 is a cross-sectional view of a substrate which comes into contact with a top surface of the substrate for the light-emitting device of FIG. 1 and is equipped with an electrode layer 60. The electrode layer 60 has a refractive index higher than the second layer 40.

As for the substrate for the light-emitting device, two interfaces take charge of an important function in order to enhance the light emitting efficiency. Among two interfaces, one is located between the light transparent substrate 10 and the first layer 30, while the other is located between first layer 30 and the second layer 40. These two interfaces allow the light propagated from an emitting layer as the wave front of the spherical wave form to be converted into the wave front of the plane wave form. Thus, configuration of these two interfaces and configuration until the light is introduced into the interfaces act as important factors in this embodiment. The present embodiment is so configured that the light exited from the emitting layer sequentially passes through the electrode layer 60, the second layer 40, the first layer 30 and the light transparent substrate 10, and then travels outside the light transparent substrate 10. Therefore, the present embodiment is designed in such a manner that, as shown as a relative value of the refractive index in FIG. 2, the refractive index goes down toward the light transparent substrate 10, and then goes up, and goes down at the light transparent substrate 10 again.

In this embodiment, because the refractive index of the second layer is set to be low with respect to the electrode layer 60, it is possible to increase a refractive index difference between the first layer 30 and the second layer 40 in a large scale. Hence, it is possible to stably realize a satisfactory conversion function of the wave front. As a result, the light emitting efficiency is remarkably improved.

Hereinafter, a detailed description will be made regarding each component constituting a substrate for a light-emitting device according to the present embodiment.

The light transparent substrate 10 is used as a light extracting substrate for the light-emitting device, and transmits at least some wavelengths of visible light range. In the present embodiment, any substrate will do for the light transparent substrate 10, so long as it is capable of transmitting at least parts of the light having a wavelength of about 400-800 nm. Further, a material for the light transparent substrate 10 may be used regardless of an inorganic substance or an organic substance. The inorganic substance may take a glass material as one example, and the organic substance may take a plastic material as one example. As the glass material, optical glass, such as fused quartz, non-alkali glass, soda glass, double flint glass or so forth, may be used. As the plastic material, engineering plastic, such as PES (polyether sulfone), PET (polyethylene terephthalate) or so on, may be used. The refractive index of the light transparent substrate 10 is preferably a range from about 1.4 to 2.1. It does not matter that the light transparent substrate 10 is coated by a barrier layer for controlling penetration of moisture or oxygen. Further, this is true of the light transparent substrate 10 having a color conversion filter or a color filter. A thickness of the light transparent substrate 10 is not particularly limited, but is preferably from about 0.1 mm to 2.0 mm.

Figure 9:
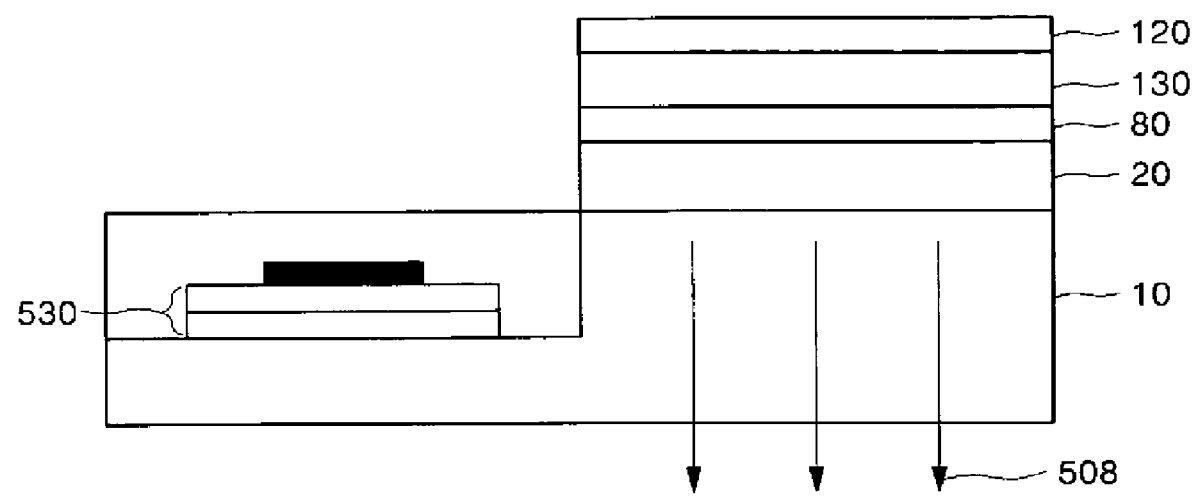
FIG. 9 shows a ninth example of an exemplary cross-sectional view of a substrate for a light-emitting device according to the present embodiment.

The substrate shown in FIGS. 1 and 2 is one for the light-emitting device. The light transparent substrate 10 is provided with a driving circuit of the light-emitting device. FIG. 9 exemplarily shows a schematic structure of an organic EL device having TFT (thin film transistor). The light transparent substrate 10 is formed with a TFT element part 530. This element is properly employed to the substrate according to the present embodiment.

Further, the substrate for the light-emitting device according to the present embodiment is fabricated by sequentially depositing the first layer 30, the second layer 40 on the light transparent substrate 10. The resulting substrate for the light-emitting device according to the present embodiment is fabricated by at least depositing the electrode layer 60 and the emitting layer thereon. Hence, in the case that the light transparent substrate 10 has an non-uniform surface, this non-uniform surface exercises influence upon the electrode layer 60 and the emitting layer, so that there is a possibility to act as a cause of an electrode short. Therefore, it is good to use the optical transparent substrate 10 having a smooth surface. Moreover, in the case of a substrate for active matrix driving, it is preferable to be smooth at a pixel part for at least driving the light-emitting device.

The first layer 30 has a refractive index higher than that of the light transparent substrate 10. For instance, when the light transparent substrate 10 has the refractive index of 1.45, the first layer 30 has the refractive index between 1.45 and 1.46, preferably of about 2.5 in the practical respect. A ratio of the refractive index of the first layer 30 to that of the light transparent substrate 10 (the refractive index of the first layer 30/the refractive index of the light transparent substrate 10) is preferably great. It is good for the ratio to be greater than 1, preferably 1.15 or more, and more preferably 1.3 or more.

By doing so, it is possible to use a glass substrate of high generality which has the refractive index of about 1.45 as the light transparent substrate 10, as well as to form an optical control layer having a function of high wave front conversion on the light transparent substrate 10.

Here, when the peak wavelength of the light exited from the emitting layer is denoted by $\lambda$, and the refractive index of the first layer 30 is denoted by $n_1$, and the thickness of the first layer is denoted by $d_1$, an optical thickness of the first layer 30, namely, $n_1 d_1$ is preferably set to a value of $0.5\lambda$ or more, more preferably of $1.0\lambda$ or more. Therefore, the light incident from the second layer 40 is appropriately subjected to the wave front conversion, thus being changed into light of the plane wave form. As a result, an increase effect on the light emitting efficiency can be stably obtained. The upper limit of $n_1 d_1$ is preferably set to a value less than $10\lambda$, and whereby the wave front conversion into the light of the plane wave form can be stably accomplished.

In the substrate for the light-emitting device, it does not matter which one of the organic substance and the inorganic substance is used as a material for the first layer 30. As the organic substance, there is used polyimide, polyurethane or so forth. As the inorganic substance, there is used $SiO_2$, $TiO_2$, $SiN_x$, $Al_2O_3$, $Ta_2O_5$, $ZrO_2$, $CeO_2$, $Y_2O_3$, $MgO$, $Nb_2O_5$, ITO or so forth. These materials may be used either separately, or in combination of two or more. Preferably, the inorganic substance is used, for example, because of thermal stability.

Anything will do for the first layer 30, so long as the light having the wavelength between 400 and 800 nm can be at least partially transmitted. These optical thin layers can be made by wet layer formation, dry layer formation or so forth. As the wet layer formation, there is used a sol-gel method or so on. Further, as the dry layer formation, there is used either a chemical vapor deposition (CVD) or a physical vapor deposition (PVD) such as an evaporation, a plasma sputtering method, an ion beam sputtering method or so forth. Specifically, as the CVD, there is used a plasma enhanced CVD, a metal organic CVD, a laser CVD, a photo chemical CVD, an electron cyclotron resonance DVD or so forth. Further, as the evaporation, there is used a resistance heating deposition, an electron beam deposition, a laser deposition, an arc discharge deposition, a high frequency heating deposition or so forth. As the plasma sputtering method, there is a direct current sputtering method, a high frequency sputtering method, an opposite target sputtering method, a magnetron sputtering method or so forth. Further, as an ion source of the ion beam sputtering method, there is a panic type, a hollow cathode type, a duoplasmatron type or so forth.

The second layer 40 is one forming an interface having the function for the wave front conversion, together with the first layer 30.

When refractive indices of the first, second and electrode layers 30, 40 and 60 are denoted by $n_1$, $n_2$ and $n_3$ respectively,
$n_1 \geq n_2$; $n_3 \geq n_2$ and $n_1 > n_3$ It is sufficient for a value of $n_1/n_2$ to have 1 or more, but preferably 1.1 or more, more preferably 1.25.

Here, when the peak wavelength of the light exited from the emitting layer is denoted by $\lambda$, and the refractive index of the second layer 40 is denoted by $n_2$, and the thickness of the second layer is denoted by $d_2$, an optical thickness of the second layer 40, namely, $n_2 d_2$ is preferably set to a value of $0.5\lambda$ or more, more preferably of $1.0\lambda$ or more. Therefore, the light exited from the second layer 40 is effectively subjected to the wave front conversion at the interface between the first and second layers 30 and 40, thus being changed into light of the plane wave form. As a result, an increase effect on the light emitting efficiency can be stably obtained. The upper limit of $n_2 d_2$ is preferably set to a value less than $10\lambda$. Therefore, the wave front conversion into the light of the plane wave form can be stably accomplished.

In the substrate for the light-emitting device, there is no limitation to a material for the second layer 40, whether it is the organic substance or the inorganic substance. As the organic substance, there is used polyimide, polyurethane or so forth. As the inorganic substance, there is used $SiO_2$, $TiO_2$, $SiN_x$, $Al_2O_3$, $Ta_2O_5$, $ZrO_2$, $CeO_2$, $Y_2O_3$, $MgO$, $Nb_2O_5$, ITO or so forth. These materials may be used either separately or in combination of two or more. Preferably, the inorganic substance is used, for example, because of thermal stability.

Anything will do for the second layer 40, so long as the light having the wavelength between 400 and 800 nm can be at least partially transmitted. These optical thin layers can be made by wet layer formation, dry layer formation or so forth. As the wet layer formation, there is used a sol-gel method or so on. Further, as the dry layer formation, there is used either a chemical vapor deposition (CVD) or a physical vapor deposition (PVD) such as an evaporation, a plasma sputtering method, an ion beam sputtering method or so forth. Specifically, as the CVD, there is used plasma enhanced CVD, metal organic CVD, laser CVD, photo chemical CVD, electron cyclotron resonance DVD or so forth. Further, as the evaporation, there is used a resistance heating deposition, an electron beam deposition, a laser deposition, an arc discharge deposition, a high frequency heating deposition or so forth. As the plasma sputtering method, there is a direct current sputtering method, a high frequency sputtering method, an opposite target sputtering method, a magnetron sputtering method or so forth. Further, as an ion source of the ion beam sputtering method, there is a panic type, a hollow cathode type, a duoplasmatron type or so forth.

Here, it is preferable to select the layer formation method where the first layer 30 is not subjected to dissolution or the like because the second layer 40 is formed after the first layer 30.

Further, it is necessary for the first and second layers 30 and 40 to select a material compatible with a process for fabricating the electrode layer or emitting layer on which these layers are formed.

In this embodiment, either the first layer 30 or the second layer 40 may be used as an auxiliary electrode which lowers a resistance of the electrode layer 60. These layers can be contributed to optical properties of the light-emitting device as well as electrical properties. When being used as the auxiliary electrode, each layer makes use of a conductive material, such as ITO, in its constituent material and is connected with the electrode layer 60, thereby reducing the resistance of the electrode layer 60. When being used the auxiliary electrode, the second layer 40 can be directly connected with the electrode layer 60. When being used the auxiliary electrode, the first layer 30 can be connected with the electrode layer 60, a contact hole and so on.

Figure 3:
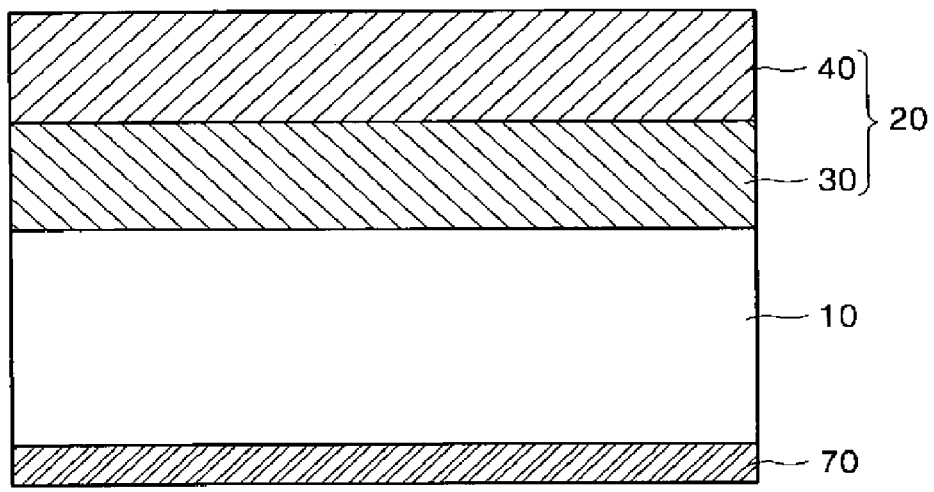
FIG. 3 shows a third example of an exemplary cross-sectional view of a substrate for a light-emitting device according to the present embodiment.

In this embodiment, it does not matter that the substrate for the light-emitting device is provided with an anti-reflection layer. In a first aspect related to the present embodiment, the anti-reflection layer is provided on an interface when the exit light travels through the substrate of the light-emitting device into the air, namely between the air layer and the light transparent substrate 10, thereby showing that the light emitting efficiency is improved. FIG. 3 is a schematic cross-sectional view of an optical device provided with an anti-reflection layer. The light transparent substrate 10 is provided with the optical control layer 20 which is formed with the anti-reflection layer 70 on one surface of the light transparent substrate, and is provided on the other surface with the first layer 30 having the refractive index higher than that of the light transparent substrate and the second layer 40 having the refractive index lower than that of the first layer 30.

In this embodiment, since the first layer 30 has higher refractive index than the electrode layer 60, the light exited from the emitting layer does not undergo much reflection until it enters the optical control layer 20. Hence, the light propagated from the emitting layer as the wave front of the spherical wave form is incident on the optical control layer 20 without much reflection, and at this layer is converted into the wave front of the plane wave form. The place where much reflection occurs is the air layer-to-the light transparent substrate interface. Thus, it is efficient to dispose the anti-reflection layer at this interface. However, in the case of disposing the anti-reflection layer at the other places, there is a possibility to reduce the efficiency of converting the wave front of the spherical wave form into the wave front of the plane wave form.

Second Embodiment

Figure 4:
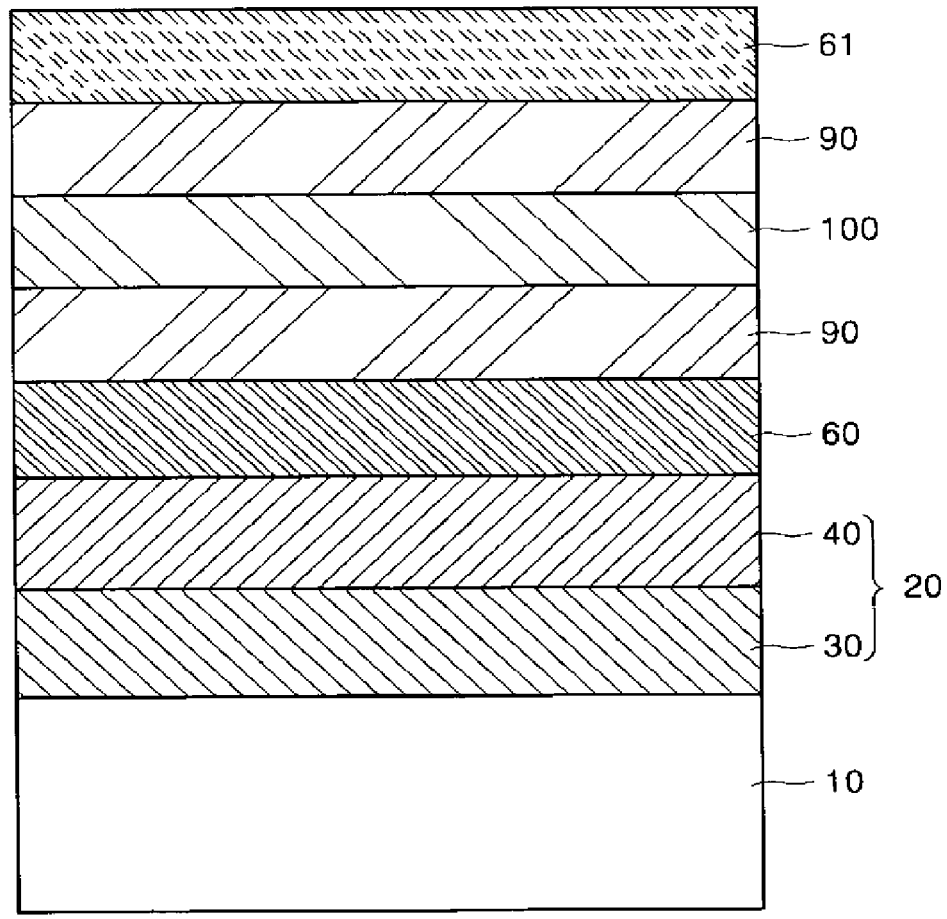
FIG. 4 shows a fourth example of an exemplary cross-sectional view of a substrate for a light-emitting device according to the present embodiment.

FIG. 4 shows one example of an exemplary cross-sectional view of an inorganic EL device using a substrate for a light-emitting device in accordance to the present embodiment. The light transparent substrate 10 has one surface provided with the optical control layer 20 on which the electrode layer 60, an insulating layer 90, an inorganic emitting layer 100, the insulating layer 90 and the electrode layer 61 are sequentially provided in that order.

The optical control layer 20 is composed of the first layer 30 having the refractive index higher than that of the light transparent substrate 10 and the second layer 40 having the refractive index higher than that of the first layer 30, both of which are sequentially provided from the light transparent substrate 10. The first layer 30 is disposed on the light transparent substrate 10. And, either a configuration of the inorganic EL device or its material may be arbitrarily selected from the well-known ones.

According to the configuration of this embodiment, the wave front of the spherical wave form exited from the emitting layer in the front (or upward) direction is converted into the wave front of the plane wave form at the optical control layer 20. As a result, the light can be efficiently emitted outside the substrate.

Third Embodiment

Figure 5:
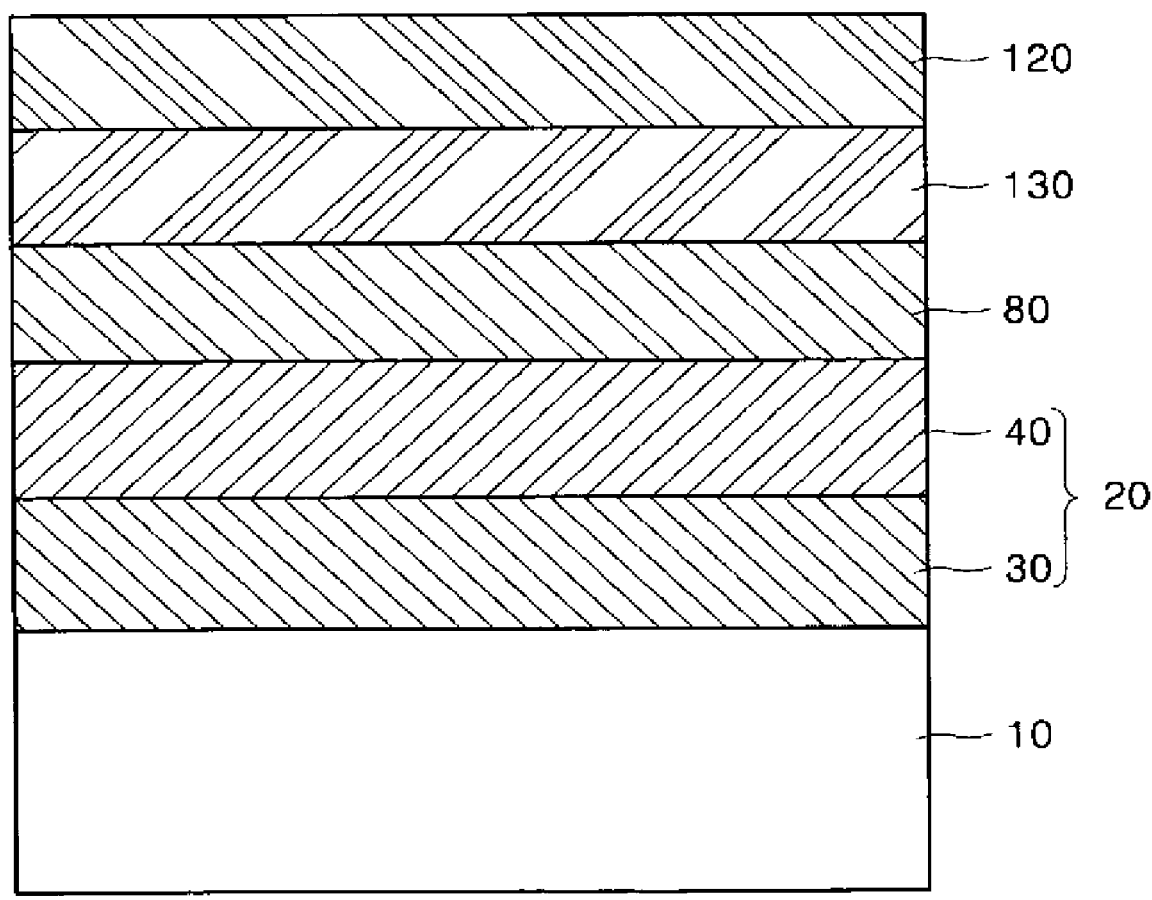
FIG. 5 shows a fifth example of an exemplary cross-sectional view of a substrate for a light-emitting device according to the present embodiment.

This embodiment shows an example where the substrate for the light-emitting device described in the first embodiment is applied to an organic EL device. FIG. 5 is an example of a schematic cross-sectional view showing a structure of an organic EL device in accordance with this embodiment. In this embodiment, the substrate for the light-emitting device is sequentially provided with a positive electrode (anode) 80, an emitting layer 130 and a negative electrode (cathode) 120.

Figure 6:
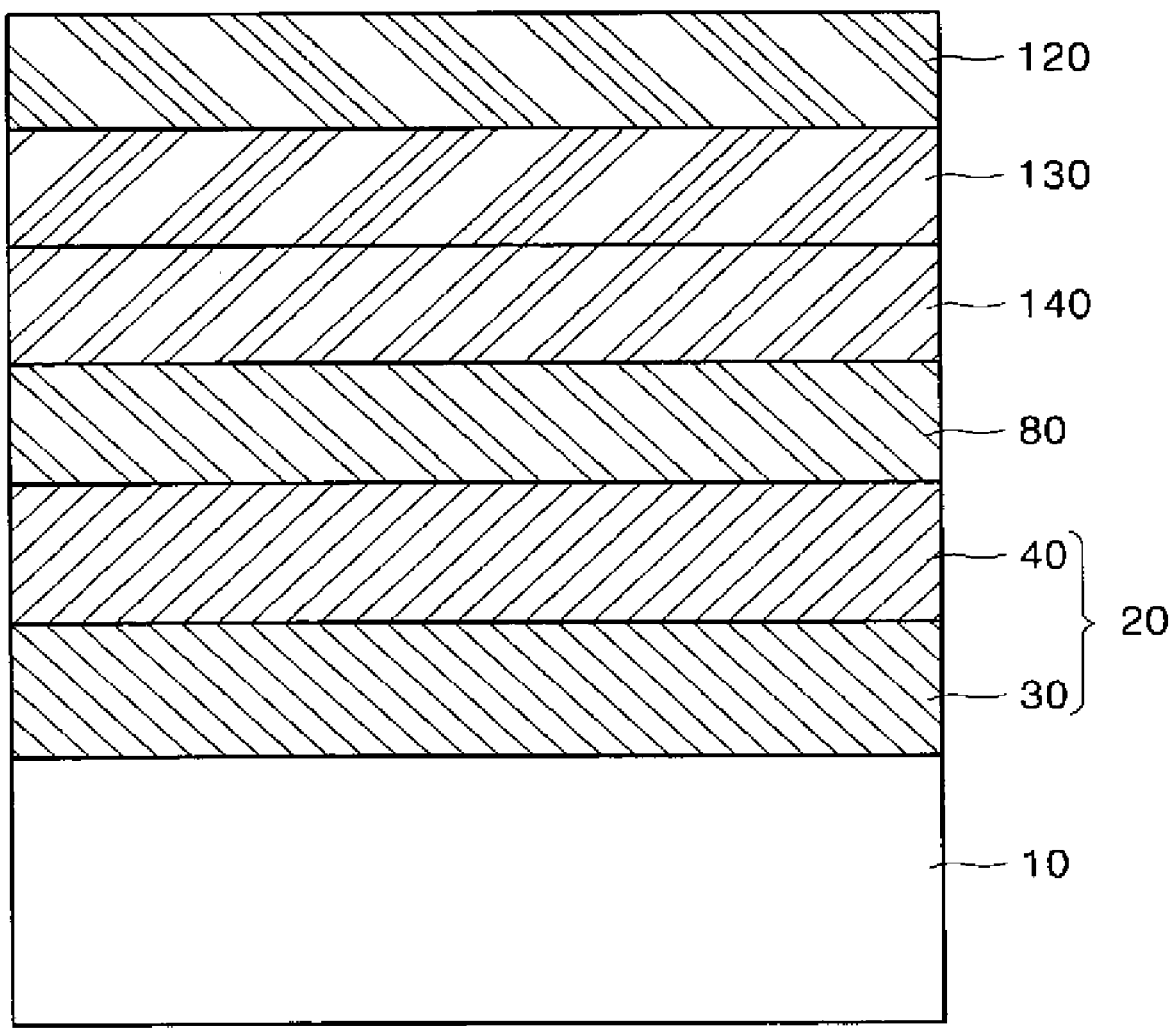
FIG. 6 shows a sixth example of an exemplary cross-sectional view of a substrate for a light-emitting device according to the present embodiment.

FIG. 6 is an example of an exemplary cross-sectional view showing another structure of an organic EL device related to this embodiment. In this embodiment, the substrate for the light-emitting device is sequentially provided with the positive electrode 80, a hole transporting layer 140, the emitting layer 130 and the negative electrode 120. In addition, other structures may be enumerated, for example a structure composed of positive electrode/hole transporting layer/emitting layer/electron transporting layer/negative electrode, another structure composed of positive electrode/emitting layer/electron transporting layer/negative electrode and so forth. And, in this embodiment, the organic EL device may make use of both a low molecular type and a high molecular type. And, in the organic EL device related to this embodiment, the substrate for the light-emitting device is disposed to allow the light exited from the emitting layer to pass through the substrate for the light-emitting device.

Various kinds of materials may be used as a hole transporting material. Specifically, examples of such a material may include a triphenyldiamine such as bis(di(p-tolyl)aminophenyl)-1,1-cyclohexane, N,N'-diphenyl-N,N'-bis(3-methylphenyl)-1,1'-biphenyl-4,4'-diamine and N,N'-diphenyl-N,N'-bis (1-Naphthyl)-1,1'-diphenyl)-4,4'-diamine, starburst molecules and so forth.

Various kinds of materials may be used as an electron transporting material. Specifically, examples of such a material may include an oxadiazole derivative such as 2-(4-diphenylyl)-5-(4-t-butylphenyl)-1,3,4-oxadiazole and bis{2-(4-t-butylphenyl)-1,3,4-oxadiazole}-m-phenylene, a triazole derivative, a quinolinol-based metal complex and so forth.

As a material for light emission, there are, for example, tris(8-quinolinol)aluminum complex (Alq3), bisdiphenylvinylbiphenyl (BDPVBi), 1,3-bis(p-t-butylphenyl-1,3,4-oxadiazolyl)phenyl (OXD-7), N,N'-bis(2,5-di-t-butylphenyl) perylenetetracarboxydiimide (BPPC), 1,4-bis(p-tolyl-p-methylstyryl)phenylamino)naphthalene and so on. Further, a layer where a charge transporting material is doped with a fluorescent material may be used as an emitting material. Examples of such a layer may include a layer where a quinolinol metal complex such as Alq3 is doped with a quinacridone derivative such as 4-dicyanomethylene-2-methyl-6-(p-dimethylaminostyryl)-4H-pyrane (DCM) or a coumarin derivative such as 3-(2'-benzothiazole)-7-diethylaminocoumarin, a layer where the electron transporting material bis(2-methyl-8-hydroxyquinoline)-4-phenylphenol-aluminum complex is doped with a condensed polycyclic aromatic such as perylene, or a layer where the hole transporting material 4,4'-bis(m-tolylphenylamino)biphenyl (TPD) is doped with rubrene and so forth.

As for the devices of FIGS. 5 and 6, the positive electrode 80 functions to inject holes into the hole transporting layer and preferably has a work function of 4.5 eV or greater. Specific examples of the positive electrode material to be used in this embodiment may include indium tin oxide (ITO), tin oxide (NESA), gold, silver, platinum and copper, and particularly ITO is effective. And, in this embodiment, it does not matter that the refractive index of the second layer 40 is higher than that of the positive electrode 80 of the organic EL device and vice versa. However, when the second layer 40 comes into contact with the positive electrode 80, the refractive index of the second layer 40 is preferably higher than that of the positive electrode 80.

Meanwhile, in order to inject electrons into the electron-transporting band or the emitting layer, as the negative electrode 120, a material having a smaller work function is preferred. Although there is no particular limitation imposed on the negative electrode material, specific examples may include indium, aluminum, magnesium, magnesium-indium alloy, magnesium-aluminum alloy, aluminum-lithium alloy, aluminum-scandium-lithium alloy and magnesium-silver alloy and so forth. And, in this embodiment, the organic EL device may make use either of a passive driving mode, or an active driving mode where an active element such as a thin film transistor (TFT) is added. There is no particular limitation to the method of forming each layer in this embodiment. Thus, any one of known methods can be properly selected. For example, these methods are exemplified by vacuum deposition, molecular beam epitaxy method (MBE method) or dipping, spin coating, casting, bar coating or roll coating of a solution in which compounds are dissolved in a solvent.

The optical control layer 20 functions to convert the wave front of the spherical wave form, which is emitted from the luminescent center of the emitting source, into the wave front of the plane wave form. Thus, the light passing through the optical control layer 20 has the wave front of the plane wave form, and is propagated in the light transparent substrate 10 in a directional state. For this reason, in the case of forming the color conversion filter or color filer, their functions can be effectively used. In other words, there are advantages in that the light emitted from the emitting layer is restrained from entering the neighboring pixels and that the purity of color is not deteriorated.

As the place where the filter is disposed, any surface of the substrate for the light-emitting device will do in this embodiment. However, in the case of the substrate for the light-emitting device in this embodiment, even when the filter is disposed on the surface opposite to the emitting layer, high color purity can be maintained during display. Generally, so far as a fabrication process is concerned, there is a difficulty in forming the electrode or the emitting layer on the color conversion filter or the color filer. By contrast, when the color conversion filter or the color filer is disposed on the surface of the light transparent substrate 10 opposite to the emitting layer, the process of fabricating the filter is independent of the process of fabricating the electrode or the emitting layer, thus being easily carried out. For example, after formation of the light-emitting device, it is possible to form the color conversion filter or the color filer. In the case of using the color conversion filter, either colors emitted from the emitting layer or kinds of the color conversion filers can be arbitrarily used. For example, when both a red conversion filter converting a blue color into a red color and a green conversion filter converting a blue color into a green color are arranged in parallel by use of a blue emitting layer, it is possible to obtain full color display.

Figure 7:
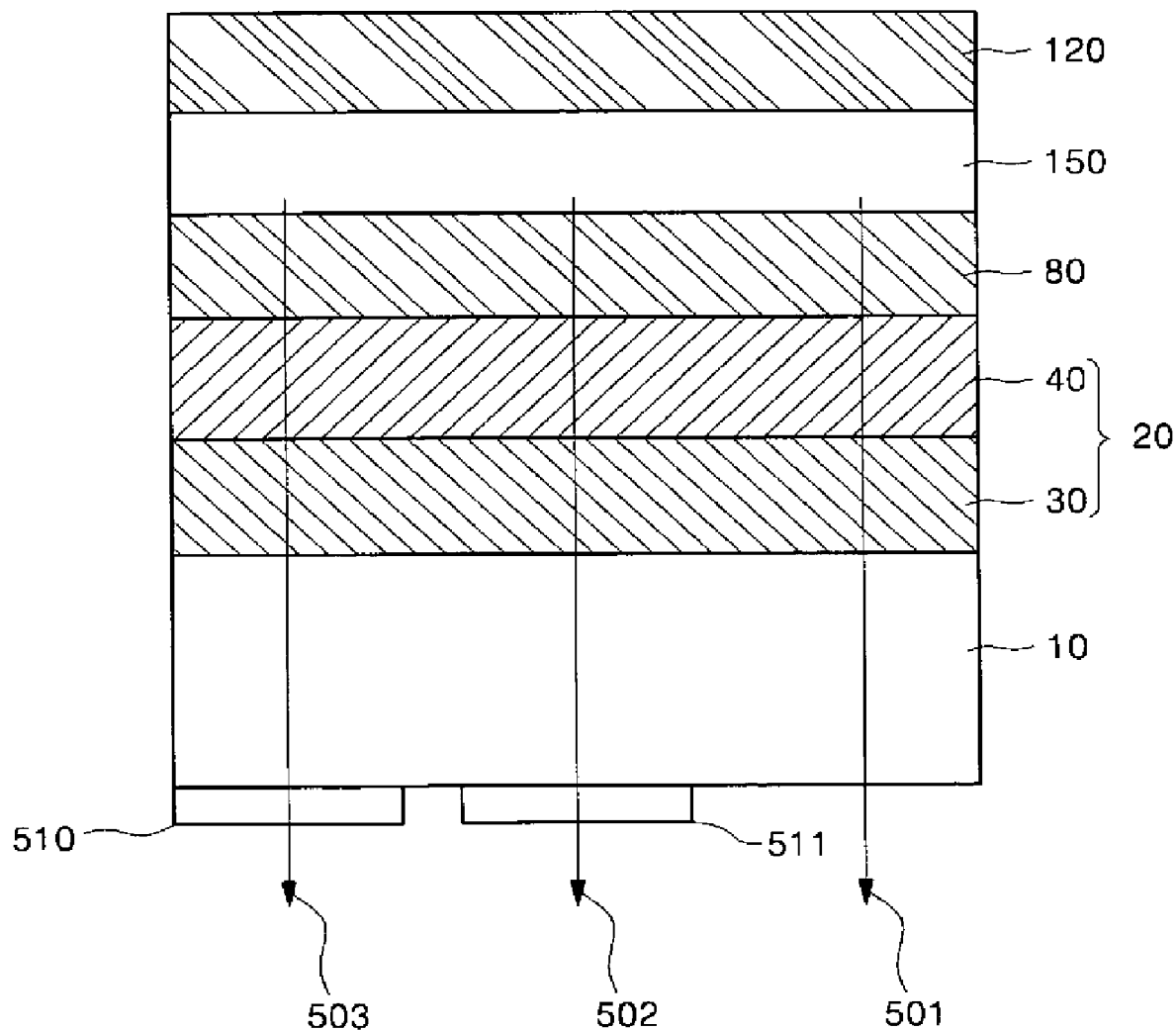
FIG. 7 shows a seventh example of an exemplary cross-sectional view of a substrate for a light-emitting device according to the present embodiment.

FIG. 7 is one example of an exemplary cross-sectional view of an organic EL device having a color conversion filter. The light transparent substrate is provided with red and green conversion filters 510 and 511 on one surface thereof, and with the optical control layer 20, the positive electrode 80, a blue emitting layer 150 and the negative electrode 120 on the other surface thereof. Blue exit light 501 is converted into red exit light 503 at the red conversion filter and into green exit light 502 at the green conversion filter. At this time, it does not matter if the blue exit light is exited either as it stands or after color purity is further enhanced by means of the color filter. As set forth above, because the light passing through the optical control layer 20 has the wave front of the plane wave form and travels in the light transparent substrate 10 in a directional manner, it is possible to obtain display without color bleeding although each of red, green and blue pixels has a small size.

Figure 8:
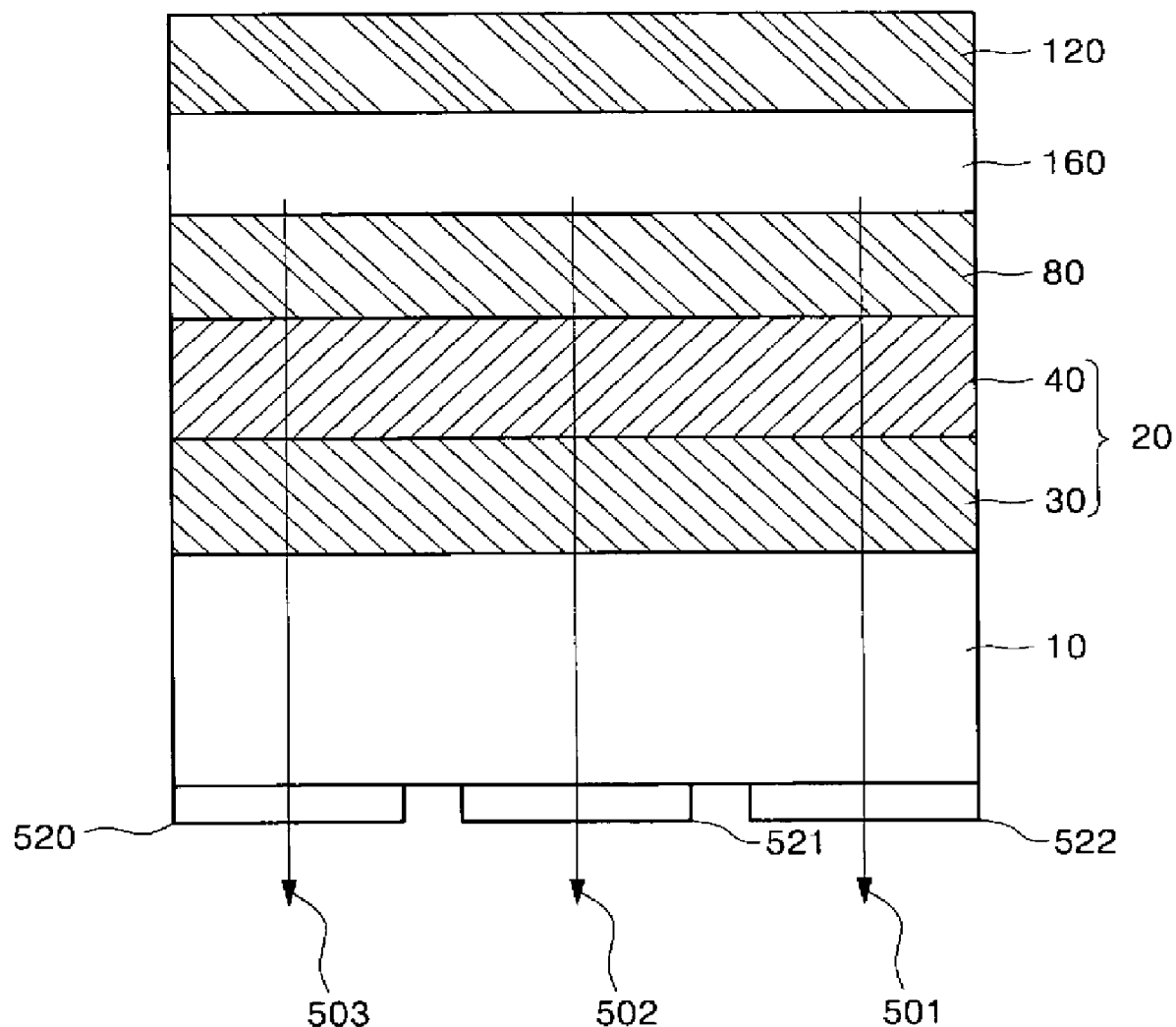
FIG. 8 shows an eighth example of an exemplary cross-sectional view of a substrate for a light-emitting device according to the present embodiment.

FIG. 8 is one example of an exemplary cross-sectional view of an organic EL device having a color filter. With a white emitting layer, full colors can be displayed by red, green and blue color filters. Specifically, the light transparent substrate 10 is provided with red, green and blue color filters 520, 521 and 522 on one surface thereof, and with the optical control layer 20, the positive electrode 80, a white emitting layer 160 and the negative electrode 120 on the other surface thereof. White emission from the white emitting layer is split into red, green and blue exit lights 503, 502 and 501 by the red, green and blue color filters 520, 521 and 522. As set forth above, because the light passing through the optical control layer 20 has the wave front of the plane wave form and travels in the light transparent substrate 10 in a directional manner, it is possible to obtain display without color bleeding although each of red, green and blue pixels has a small size.

In this embodiment, the substrate for the light-emitting device can be used as an encapsulating material of the organic EL device. As mentioned above, in the organic EL device of this embodiment, the substrate for the light-emitting device is disposed so that the light exited from the emitting layer passes through the substrate for the light-emitting device. In the case of a top emitting type or reverse type of the organic EL device where the light from the emitting layer is exited in a direction opposite to the substrate provided with the electrode layer 60 or the emitting layer, the substrate for the light-emitting device in this embodiment can be used as the encapsulating material. When being used as the encapsulating material, the substrate is preferably bonded on the surface of the light-emitting device.

FIGS. 4 to 8 have shown the layer structure of the light-emitting device part, but in fact the light transparent substrate 10 is provided with the driving circuit for the light-emitting device such as a TFT element. FIG. 9 exemplarily shows a schematic structure of an organic EL device having a TFT element. The light transparent substrate 10 is provided with a TFT element part 530 within a region where the driving circuit is formed (referred to as "driving circuit formation region"). Meanwhile, within a region where the light-emitting device is formed (referred to as "light-emitting device formation region") in the light transparent substrate 10, the light-emitting device composed of the optical control layer 20, the positive electrode 80, the emitting layer 130 and the negative electrode 120 is provided. A layer structure of the light-emitting device is not limited to that shown in the figure, but other various structures may be used. This figure does not show the color filter or the color conversion filter. Here, in the case that a pixel display part of the TFT substrate is configured to have a high refractive index layer, this high refractive index layer may be used as the first layer 30.

Fourth Embodiment

Figure 10:
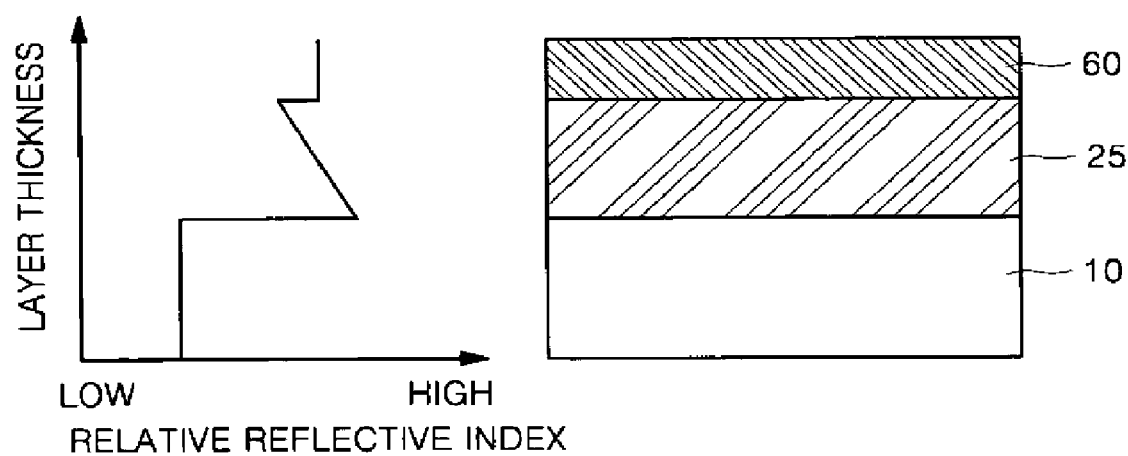
FIG. 10 shows one example of a structure of an optical control layer.

In this embodiment, a configuration of the substrate for the light-emitting device is shown in FIG. 10. An optical control layer 25 is made of a dielectric doped with at least one impurity metal therein. An impurity concentration distribution in the optical control layer 25 is adapted to be gradually increased from the light transparent substrate 10 toward the electrode layer 60. Therefore, the refractive index is gradually decreased from the light transparent substrate 10 toward the electrode layer 60.

The optical control layer 20 is composed of a mixture, for example, of $SiO_2$ or $MgF_2$ and the impurity metal. Examples of the impurity metal may include Cr, Ag, Al and so forth. A doped amount of the metal can be properly selected, but is generally set to 5 mol % or less with respect to the whole materials constituting the optical control layer 25. Therefore, it is possible to prevent decrease of transmittance which results from adsorption of the metal.

In this embodiment, the refractive index is modulated within the optical control layer 25 by means of adjustment of the impurity concentration. In the region where the refractive index is increased in a direction in which the light travels, the directionality of the light is adapted to be increased in such a manner that the wave front conversion takes place, and thus the light is converted from the spherical wave form into the plane wave form. In this embodiment, this wave front conversion is not carried out at a single interface, but several times at the place where the refractive index is modulated within the optical control layer 25. For this reason, the wave front conversion into the light of the plane wave form is firmly accomplished.

Since the substrate according to this embodiment has the configuration as mentioned above, reflection or loss of the light is lowered at the interface between the optical control layer 25 and the light transparent substrate 10, and the light emitting efficiency is remarkably increased. As set forth above, the present invention has been described on the basis of the embodiments. These embodiments are simply illustrative of the principles of the invention. It will be understood by those skilled in the art that various other modifications and changes may be provided and fall within the spirit and scope the present invention.

For example, the embodiments has illustrated and described the EL device, but may be applied to other light-emitting devices such as a light-emitting diode. The light-emitting device is, for example, used as a display device.

Further, although the optical control layer 20 has been illustrated as the structure of two layers, it is not limited to this structure, but it will do for a structure of three layers or more.

EXAMPLES

The present invention will be described in more detail on the basis of the Examples. In the following Examples, an emission characteristic of the organic EL device was measured under the condition that a photometer (e.g. TOPCON BM-5A) was arranged in a direction normal to a substrate and that a collection angle was 0.1 degree. Further, a current efficiency of the organic EL device was measured under the condition that an area of the emitting portion of the organic EL device was 4 $mm^2$, that a direct current voltage was applied to the organic EL device, and that luminance was 100 $cd/m^2$. In addition, all of the used light transparent substrates had a thickness of 0.7 mm.

Example 1

A fused quartz having a refractive index of 1.457 was used as the light transparent substrate. Both a $TiO_2$ layer having a refractive index of 2.30 and a thickness of 600 nm, as a first layer of an optical control layer, and a $TiO_2/SiO_2$ mixture layer having a refractive index of 1.70 and a thickness of 600 nm, as a second layer of the optical control layer, were formed on one surface of the light transparent substrate by a sputtering method. As a result, the optical substrate was prepared.

Subsequently, ITO was formed as a positive electrode on the prepared optical substrate by a sputtering method so that its sheet resistance was 20 Ω/□ (ohms per square area). The formed layer of ITO had a thickness of 100 nm and a refractive index of 1.78. Next, as organic layers, the following two layers were formed on the ITO. To begin with, a hole transporting layer, i.e., N,N'-diphenyl-N,N'-bis(3-methylphenyl)-1,1'-biphenyl-4,4'-diamine, was formed at a thickness of 50 nm by a vacuum deposition, and then an emitting layer, tris (8-quinolinolate)aluminum, was formed at a thickness of 70 nm by a vacuum deposition. Finally, a negative electrode was formed at a thickness of 150 nm, which co-deposited a magnesium-silver alloy at a ratio of deposition rates of 9:1. As a result, the organic EL device having green emission (a peak wavelength of 530 nm) was prepared.

The current efficiency of the prepared organic EL device was 5.1 cd/A.

Example 2

A fused quartz having a refractive index of 1.457 was used as the light transparent substrate. Both a $TiO_2$ layer having a refractive index of 2.30 and a thickness of 700 nm, as a first layer of an optical control layer, and an $SiO_2$ layer having a refractive index of 1.50 and a thickness of 826 nm, as a second layer of the optical control layer, were formed on one surface of the light transparent substrate by a sputtering method. As a result, the optical substrate was prepared.

A positive electrode (ITO), an organic layer and a negative layer were formed on the prepared optical substrate. These positive electrode (ITO), organic layer and negative layer had the same condition as Example 1. The current efficiency of the prepared organic EL device was 4.5 cd/A.

Example 3

A fused quartz having a refractive index of 1.457 was used as the light transparent substrate. Both a $TiO_2$ layer having a refractive index of 2.40 and a thickness of 670 nm, as a first layer of an optical control layer, and an SiO$_2$ layer having a refractive index of 1.43 and a thickness of 1000 nm, as a second layer of the optical control layer, were formed on one surface of the light transparent substrate by a sputtering method. As a result, the optical substrate was prepared.

A positive electrode (ITO), an organic layer and a negative layer were formed on the prepared optical substrate. These positive electrode (ITO), organic layer and negative layer had the same condition as Example 1. The current efficiency of the prepared organic EL device was 4.5 cd/A.

Example 4

A fused quartz having a refractive index of 1.457 was used as the light transparent substrate. A SiN$_x$ layer having a refractive index of 2.01 and a thickness of 800 nm, as a first layer of an optical control layer, and an SiO$_2$ layer having a refractive index of 1.42 and a thickness of 530 nm, as a second layer of the optical control layer, were formed on one surface of the light transparent substrate by a CVD method and a sputtering method, respectively. As a result, the optical substrate was prepared. A positive electrode (ITO), an organic layer and a negative layer were formed on the prepared optical substrate. These positive electrode (ITO), organic layer and negative layer had the same condition as Example 1. The current efficiency of the prepared organic EL device was 4.4 cd/A.

Example 5

It was identical to the condition of Example 3, except that a double flint glass having a refractive index of 1.95 was used as the light transparent substrate. The current efficiency of the prepared organic EL device was 4.4 cd/A.

Example 6

A fused quartz having a refractive index of 1.457 was used as the light transparent substrate. Both a SiN$_x$ layer having a refractive index of 2.01 and a thickness of 800 nm, as a first layer of an optical control layer, and an SiO$_2$ layer having a refractive index of 1.42 and a thickness of 720 nm, as a second layer of the optical control layer, were formed on one surface of the light transparent substrate by a CVD method and a sputtering method, respectively. As a result, the optical substrate was prepared.

A positive electrode (ITO), an organic layer and a negative layer were formed on the prepared optical substrate. These positive electrode (ITO), organic layer and negative layer had the same condition as Example 1. The current efficiency of the prepared organic EL device was 4.2 cd/A.

Example 7

A fused quartz having a refractive index of 1.457 was used as the light transparent substrate. Both a TiO$_2$ layer having a refractive index of 2.40 and a thickness of 670 nm, as a first layer of an optical control layer, and an SiO$_2$ layer having a refractive index of 1.43 and a thickness of 900 nm, as a second layer of the optical control layer, were formed on one surface of the light transparent substrate by a sputtering method. Further, a SiN$_x$ layer having a refractive index of 2.00 and a thickness of 50 nm, as a light coloring layer, was formed. As a result, the optical substrate was prepared.

A positive electrode (ITO), an organic layer and a negative layer were formed on the prepared optical substrate. These positive electrode (ITO), organic layer and negative layer had the same condition as Example 1. The current efficiency of the prepared organic EL device was 4.5 cd/A.

Example 8

A fused quartz having a refractive index of 1.457 was used as the light transparent substrate. Both a TiO$_2$ layer having a refractive index of 2.40 and a thickness of 670 nm, as a first layer of an optical control layer, and an SiO$_2$ layer having a refractive index of 1.43 and a thickness of 900 nm, as a second layer of the optical control layer, were formed on one surface of the light transparent substrate by a sputtering method. As a result, the optical substrate was prepared. Further, a layer having a gradient refractive index from 1.45 to 1.78 as it is spaced apart from the second layer of the optical control layer and a thickness of 100 nm was formed on the second layer of the optical control layer by a sputtering method.

A positive electrode (ITO), an organic layer and a negative layer were formed on the prepared optical substrate. These positive electrode (ITO), organic layer and negative layer had the same condition as Example 1. The current efficiency of the prepared organic EL device was 4.6 cd/A.

Example 9

A fused quartz having a refractive index of 1.457 was used as the light transparent substrate. Both a TiO$_2$ layer having a refractive index of 2.40 and a thickness of 670 nm, as a first layer of an optical control layer, and an SiO$_2$ layer having a refractive index of 1.43 and a thickness of 900 nm, as a second layer of the optical control layer, were formed on one surface of the light transparent substrate by a sputtering method. As a result, the optical substrate was prepared. Further, a layer having a gradient refractive index from 1.45 to 2.0 as it is spaced apart from the second layer of the optical control layer and a thickness of 100 nm was formed on the second layer of the optical control layer by a sputtering method. Furthermore, a SiN$_x$ layer having a refractive index of 2.00 and a thickness of 50 nm, as a light coloring layer, was formed. As a result, the optical substrate was prepared.

A positive electrode (ITO), an organic layer and a negative layer were formed on the prepared optical substrate. These positive electrode (ITO), organic layer and negative layer had the same condition as Example 1. The current efficiency of the prepared organic EL device was 4.8 cd/A.

Example 10

As the light transparent substrate, there is used a soda glass which had a refractive index of 1.512 and an anti-reflection layer, a MgF$_2$ layer, having a refractive index of 1.38 and a thickness of 97 nm on one surface thereof. Both a TiO$_2$ layer having a refractive index of 2.30 and a thickness of 700 nm, as a first layer of an optical control layer, and an SiO$_2$ layer having a refractive index of 1.50 and a thickness of 826 nm, as a second layer of the optical control layer, were formed on one surface of the light transparent substrate by a sputtering method.

A positive electrode (ITO), an organic layer and a negative layer were formed on the prepared optical substrate. These positive electrode (ITO), organic layer and negative layer had the same condition as Example 1. The current efficiency of the prepared organic EL device was 4.6 cd/A.

Example 11

As the light transparent substrate, there is used a soda glass which had a refractive index of 1.512, an anti-reflection layer, a $MgF_2$ layer, having a refractive index of 1.38 and a thickness of 97 nm on one surface thereof, and another anti-reflection layer having a refractive index continuously changed from 1.52 to 2.30 as it is spaced apart from the light transparent layer and a thickness of 100 nm on the other surface thereof. Both a $TiO_2$ layer having a refractive index of 2.30 and a thickness of 700 nm, as a first layer of an optical control layer, and an $SiO_2$ layer having a refractive index of 1.50 and a thickness of 826 nm, as a second layer of the optical control layer, were formed on one surface of the light transparent substrate by a sputtering method.

A positive electrode (ITO), an organic layer and a negative layer were formed on the prepared optical substrate. These positive electrode (ITO), organic layer and negative layer had the same condition as Example 1. The current efficiency of the prepared organic EL device was 4.7 cd/A.

Comparative Example 1

It was identical to the condition of Example 1, except that a thickness of $TiO_2/SiO_2$ mixture layer was 20 nm. The current efficiency of the prepared organic EL device was 2.8 cd/A, and no improvement of the light emitting efficiency was observed.

Comparative Example 2

It was identical to the condition of Example 1, except that a thickness of $TiO_2/SiO_2$ mixture layer was 3.5 μm. The current efficiency of the prepared organic EL device was 2.9 cd/A, and no improvement of the light emitting efficiency was observed.

Comparative Example 3

It was identical to the condition of Example 2, except that a $SiO_2$ layer having a refractive index of 1.25 was used as a second layer of an optical control layer by a sol-gel method. The current efficiency of the prepared organic EL device was 3.1 cd/A, and a plurality of spots where light is not emitted (dark spots) was observed.

The evaluation results of Examples and Comparative Examples were as follows. In Tables below, the refractive index of the first layer was denoted by $n_1$, the thickness of the first layer $d_1$, the refractive index of the second layer $n_2$, the thickness of the second layer $d_2$, the refractive index of the positive electrode $n_3$. Further, the refractive index of the light transparent substrate was denoted by n(sub).

As can be seen from the foregoing, the present invention has a configuration including the optical control portion which converts the incident light of the spherical wave into the light of the plane wave form and induces the converted light to the transparent substrate, so that the exit light can be transmitted outside the transparent substrate at a good efficiency. Thus, it is possible to provide the light-emitting device having high brightness and excellent visibility.

It should be understood to those skilled in the art that, while the present invention has been described with reference to the preferred embodiments, various other modifications and changes may be provided within the spirit and scope the present invention defined in the following claims.

TABLE 1

|  | Example 1 | Example 2 | Example 3 | Example 4 | Example 5 | Example 6 |
|---|---|---|---|---|---|---|
| Refractive index of first layer | 2.30 | 2.30 | 2.40 | 2.01 | 2.40 | 2.01 |
| Thickness of first layer (nm) | 600 | 700 | 670 | 800 | 670 | 800 |
| Refractive index of second layer | 1.70 | 1.50 | 1.43 | 1.42 | 1.43 | 1.42 |
| Thickness of second layer (nm) | 600 | 826 | 1000 | 530 | 1000 | 720 |
| Refractive index of electrode layer | 1.78 | 1.78 | 1.78 | 1.78 | 1.78 | 1.78 |
| Thickness of electrode layer (nm) | 100 | 100 | 100 | 100 | 100 | 100 |
| Wavelength of emitted light (nm) | 530 | 530 | 530 | 530 | 530 | 530 |
| Efficiency of current (cd/A) | 5.1 | 4.5 | 4.5 | 4.4 | 3.2 | 4.2 |
| Refractive index of substrate | 1.457 | 1.457 | 1.457 | 1.457 | 1.950 | 1.457 |
| $n_1 d_1/\lambda$ | 2.6 | 3.0 | 3.0 | 3.0 | 3.0 | 3.0 |
| $n_2 d_2/\lambda$ | 1.9 | 2.3 | 2.7 | 1.4 | 2.7 | 1.9 |
| $n_1/n(sub)$ | 1.58 | 1.58 | 1.65 | 1.38 | 1.23 | 1.38 |
| $n_1/n_2$ | 1.35 | 1.53 | 1.68 | 1.42 | 1.68 | 1.42 |
| $n_2/n_3$ | 0.96 | 0.84 | 0.80 | 0.80 | 0.80 | 0.80 |

TABLE 2

|  | Example 7 | Example 8 | Example 9 | Example 10 | Example 11 |
|---|---|---|---|---|---|
| Refractive index of first layer | 2.40 | 2.40 | 2.40 | 2.30 | 2.30 |
| Thickness of first layer (nm) | 670 | 670 | 670 | 700 | 700 |
| Refractive index of second layer | 1.43 | 1.43 | 1.43 | 1.50 | 1.50 |
| Thickness of second layer (nm) | 900 | 900 | 900 | 826 | 826 |
| Refractive index of electrode layer | 1.78 | 1.78 | 1.78 | 1.78 | 1.78 |
| Thickness of electrode layer (nm) | 100 | 100 | 100 | 100 | 100 |
| Wavelength of emitted light (nm) | 530 | 530 | 530 | 530 | 530 |
| Efficiency of current (cd/A) | 4.5 | 4.6 | 4.8 | 4.6 | 4.7 |
| Refractive index of substrate | 1.457 | 1.457 | 1.457 | 1.512 | 1.512 |
| $n_1 d_1/\lambda$ | 3.0 | 3.0 | 3.0 | 3.0 | 3.0 |
| $n_2 d_2/\lambda$ | 2.4 | 2.4 | 2.4 | 2.3 | 2.3 |
| $n_1/n(\text{sub})$ | 1.65 | 1.65 | 1.65 | 1.52 | 1.52 |
| $n_1/n_2$ | 1.68 | 1.68 | 1.68 | 1.53 | 1.53 |
| $n_2/n_3$ | 0.96 | 0.84 | 0.80 | 0.84 | 0.84 |
| Remarks | Coloring layer | Gradient layer | Gradient layer Anti-reflection layer | Anti-reflection layer | Anti-reflection layer |

TABLE 3

|  | Comparative Example 1 | Comparative Example 2 | Comparative Example 3 |
|---|---|---|---|
| Refractive index of first layer | 2.30 | 2.30 | 2.30 |
| Thickness of first layer (nm) | 600 | 600 | 700 |
| Refractive index of second layer | 1.70 | 1.70 | 1.25 |
| Thickness of second layer (nm) | 20 | 3500 | 826 |
| Refractive index of electrode layer | 1.78 | 1.78 | 1.78 |
| Thickness of electrode layer (nm) | 100 | 100 | 100 |
| Wavelength of emitted light (nm) | 530 | 530 | 530 |
| Efficiency of current (cd/A) | 2.8 | 2.9 | 3.1 |
| Refractive index of substrate | 1.457 | 1.457 | 1.457 |
| $n_1 d_1/\lambda$ | 2.6 | 2.6 | 3.0 |
| $n_2 d_2/\lambda$ | 0.1 | 11.2 | 1.9 |
| $n_1/n(\text{sub})$ | 1.457 | 1.457 | 1.457 |
| $n_1/n_2$ | 1.35 | 1.35 | 1.84 |
| $n_2/n_3$ | 0.96 | 0.96 | 0.70 |

What is claimed is:

1. A substrate for a light-emitting device, comprising:
a transparent substrate; and
an optical control portion provided directly on the transparent substrate,
wherein the optical control portion comprises:
a first layer provided directly on the transparent substrate;
a second layer provided directly on the first layer, the second layer having a refractive index less than that of the first layer; and
a light coloring layer on the second layer, the light coloring layer having a refractive index higher than that of the second layer.

2. The substrate as claimed in claim 1, wherein a following expression is satisfied:

$$n1 \geq 1.3 n2$$

where n1 is the refractive index of the first layer, and n2 is the refractive index of the second layer.

3. The substrate as claimed in claim 1, further comprising an electrode layer on the optical control layer, and the refractive index of the second layer is less than that of the electrode layer.

4. The substrate as claimed in claim 3, wherein the refractive index of the first layer is greater than that of the electrode layer.

5. The substrate as claimed in claim 1, wherein, when the light-emitting device having a peak wavelength of emission is mounted on the substrate for the light-emitting device, a following expression is satisfied:

$$n1 d1 \geq \lambda/2$$

where n1 is the refractive index of the first layer, and d1 is the thickness of the first layer.

6. The substrate as claimed in claim 1, wherein, when the light-emitting device having a peak wavelength of emission is mounted on the substrate for the light-emitting device, a following expression is satisfied:

$$n2 d2 \lambda/2$$

where n2 is the refractive index of the second layer, and d2 is the thickness of the second layer.

7. The substrate as claimed in claim 1, wherein the transparent substrate is provided with a driving circuit for the light-emitting device.

8. A light-emitting device, comprising:

a transparent substrate;

an optical control portion provided directly on the transparent substrate to convert incident light of a spherical wave into light of a plane wave form and to induce the converted light to the transparent substrate;

an electrode layer provided on the optical control portion; and an emitting layer provided on the electrode layer, wherein the optical control portion comprises:

a first layer provided directly on the transparent substrate;

a second layer provided directly on the first layer, the second layer having a refractive index less than that of the first layer; and a light coloring layer on the second layer, the light coloring layer having a refractive index higher than that of the second layer.

9. The light-emitting device as claimed in claim 8, wherein a following expression is satisfied:

$$n1 \geq 1.3 n2$$

where n1 is the refractive index of the first layer, and n2 is the refractive index of the second layer.

10. The light-emitting device as claimed in claim 8, wherein the refractive index of the second layer is less than that of the electrode layer.

11. The light-emitting device as claimed in claim 10, wherein the refractive index of the first layer is more than that of the electrode layer.

12. The light-emitting device as claimed in claim 8, wherein a following expression is satisfied:

$$n1 d1 \geq \lambda/2$$

where $\lambda$ is the peak wavelength of emission of the emitting layer, n1 is the refractive index of the first layer, and d1 is the thickness of the first layer.

13. The light-emitting device as claimed in claim 8, wherein a following expression is satisfied:

$$n2 d2 \geq \lambda/2$$

where $\lambda$ is the peak wavelength of emission of the emitting layer, n2 is the refractive index of the second layer, and d2 is the thickness of the second layer.

14. The light-emitting device as claimed in claim 8, wherein the transparent substrate is provided with a color conversion filter.

15. The light-emitting device as claimed in claim 8, wherein the transparent substrate is provided with a color filter.

16. The light-emitting device as claimed in claim 8, wherein the emission from the emitting layer is monochromatic light.

17. The light-emitting device as claimed in claim 16, wherein the monochromatic light is blue light.

18. The light-emitting device as claimed in claim 8, wherein the light-emitting device is an organic electroluminescence device.

* * * * *